United States Patent [19]

Ting

[11] Patent Number: 5,248,377
[45] Date of Patent: Sep. 28, 1993

[54] CRYSTAL-GROWTH FURNACE FOR INTERFACE CURVATURE CONTROL

[75] Inventor: Edmund Y. Ting, Flushing, N.Y.

[73] Assignee: Grumman Aerospace Corporation, Bethpage, N.Y.

[21] Appl. No.: 444,268

[22] Filed: Dec. 1, 1989

[51] Int. Cl.$^5$ .............................................. C30B 11/00
[52] U.S. Cl. ........................... 156/616.1; 164/122.1; 164/122.2
[58] Field of Search ............... 156/616.1, 616.2, 616.4, 156/616.41, 620.7, 620.76; 422/248; 164/122.1, 122.2; 373/17, 139

[56] References Cited

U.S. PATENT DOCUMENTS

| | | | |
|---|---|---|---|
| 2,719,799 | 10/1955 | Christian | 156/616.4 |
| 2,990,257 | 6/1961 | Heneage et al. | 156/620.7 |
| 3,188,373 | 6/1965 | Brunet et al. | 156/616.2 |
| 3,592,455 | 7/1971 | Gallet et al. | 156/616.4 |
| 3,796,548 | 3/1974 | Boss et al. | 156/616.2 |
| 3,882,942 | 5/1975 | Rohatgi et al. | 164/353 |
| 3,897,815 | 8/1975 | Smashey | 164/122.1 |
| 3,984,280 | 10/1976 | Besselere et al. | 156/616.2 |
| 4,050,905 | 9/1977 | Swinehart | 156/616.4 |
| 4,086,424 | 4/1978 | Mellen, Sr. | 156/616.4 |
| 4,096,024 | 6/1978 | Dusserre et al. | 156/616.3 |
| 4,116,641 | 9/1978 | Ciszek | 156/620.1 |
| 4,157,373 | 6/1979 | Berkman et al. | 422/246 |
| 4,178,986 | 12/1979 | Smashey | 164/122.1 |
| 4,409,451 | 10/1983 | Taylor | 219/10.491 |
| 4,563,558 | 1/1986 | Rhemer et al. | 219/10.491 |
| 4,687,538 | 8/1987 | Pastor | 156/616.4 |
| 4,925,636 | 5/1990 | Hemmerdinger et al. | 156/616.1 |

FOREIGN PATENT DOCUMENTS

| | | | |
|---|---|---|---|
| 3322175 | 5/1984 | Fed. Rep. of Germany | 156/616.4 |
| 56-100200 | 8/1981 | Japan | 156/616.2 |
| 64-37487 | 2/1989 | Japan | 156/620.76 |
| 824341 | 11/1959 | United Kingdom | 156/616.1 |
| 1173690 | 12/1969 | United Kingdom | 156/616.4 |

Primary Examiner—R. Bruce Breneman
Attorney, Agent, or Firm—Pollock, VandeSande & Priddy

[57] ABSTRACT

In a Bridgman-type apparatus for growing single crystals, a pair of different gradient sections is located around the respective liquid and solid phases of a sample undergoing solidification. Each gradient section is chosen with thermal characteristics matching the thermal properties of the sample and more particularly taking into consideration the difference in thermal conductivity between the liquid and solid phases. The result is a better match or control of the temperature profile between the furnace and the sample material undergoing solidification which results in improved interface shape control.

1 Claim, 1 Drawing Sheet

CRYSTAL-GROWTH FURNACE FOR INTERFACE CURVATURE CONTROL

FIELD OF THE INVENTION

The present invention relates to furnaces for growing crystals used in semiconductors, and more particularly to apparatus for controlling radial heat transfer in the solidification region of a furnace-enclosed sample.

BACKGROUND OF THE INVENTION

Bulk grown (from-the-melt) semiconductor single crystals are basic ingredients for modern electronic and sensor devices. The directional solidification of single crystals is a difficult process due to various problems, one of which is the difficulty of precisely controlling the solid/liquid interface shape. This lack of control is due to temperature differential between the "adiabatic zone" of the furnace and the solidifying material. The cause of this is the difference in thermal conductivity between the liquid and solid phases and the inability to create a truly adiabatic zone in which no radial heat transfer occurs. Radial heat transfer produces a non-linear interface shape and potentially an increase in the convection effects. A better matched or controlled temperature profile between furnace and the material to be solidified will result in improved interface shape control.

BRIEF DESCRIPTION OF THE INVENTION

The present invention provides a method that will permit the control of the freeze front shape during the directional solidification of a single crystal by the control of the radial heat transfer in the region of solidification in a Bridgman-type configuration by the use of a specially tailored temperature profile within the region of solidification.

A furnace design is proposed which will control the temperature profile of the furnace in the region of solidification to gain control over the sample heat flux and thus the liquid/solid interface shape. This control will be implemented by the use of a furnace solidification region which is constructed with specific thermal characteristics based upon the thermal properties of the sample and the active control of the adjacent furnace zone-temperatures. Thermal characteristics can be regulated by either using different materials of construction (i.e., different thermal conductivity) or by variations in shape. In conjunction with the present invention, the active temperature control will be achieved through a computer control algorithm which will use sample position as well as temperature to regulate furnace zone-temperatures and maintain a known and constant temperature gradient profile in the sample. Translation of the furnace along a sample containing ampoule causes a traveling melt-solidification interface to be created through the length of the sample thus enabling growth of a single crystal.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
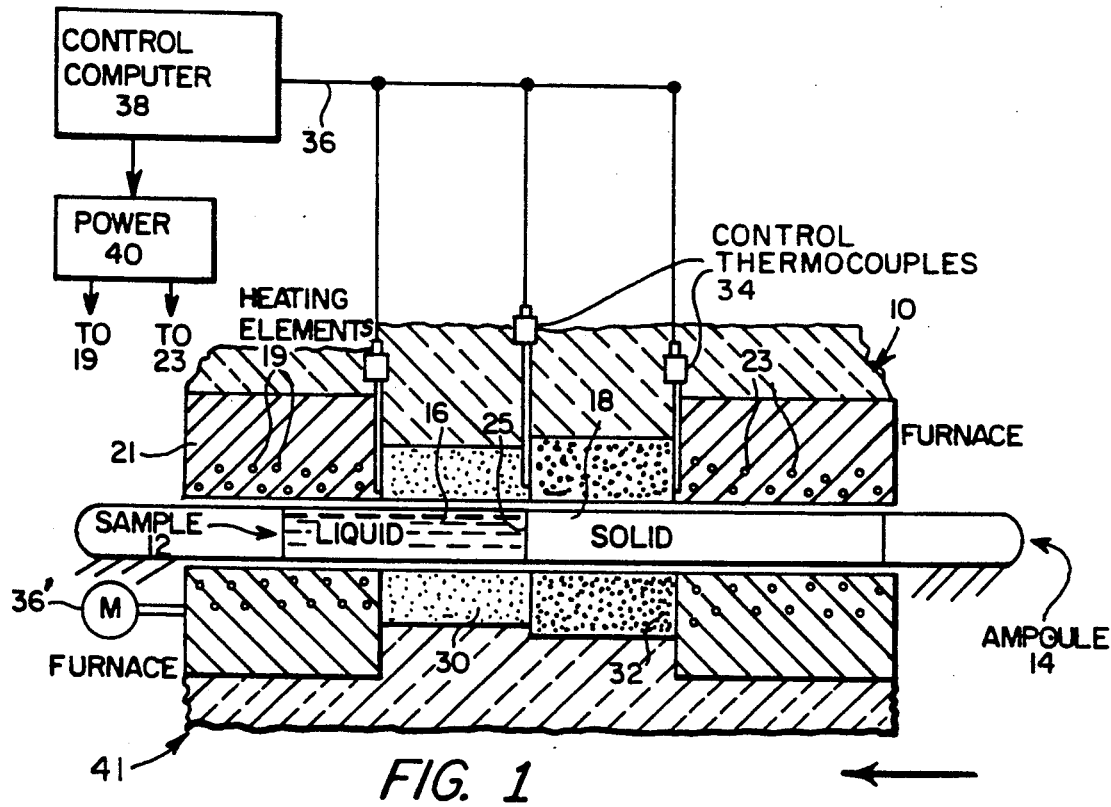
FIG. 1 is a diagrammatic sectional view of the present furnace design enclosing an axially disposed sample containing ampoule.

In FIG. 1 the furnace of the present invention is generally indicated by reference numeral 10 and encloses an axially extending ampoule 14 in which is located a sample crystal which is undergoing traveling melt-solidification to reform the crystal as a single crystal structure. The concept of moving a temperature gradient or profile relative to a crystalline sample is well known in the prior art and forms the basis of conventional Bridgman-type furnaces. Thus in FIG. 1 the furnace is intended to move axially relative to ampoule 14, as indicated by the directional arrows. As this occurs, the interface between the liquid portion 16 and solid portion 18 travels linearly across the ampoule 14.

FIG. 1 schematically illustrates the liquid-solid phases within a solidification region which is free of radially outwardly disposed heater elements. In order to maintain a temperature differential across the solidification region 20, heating elements 19 are encased within a supporting structure 21 with preselected thermal characteristics and operate at an elevated temperature relative to a second set of heater elements 23 similarly encased.

Figure 2:
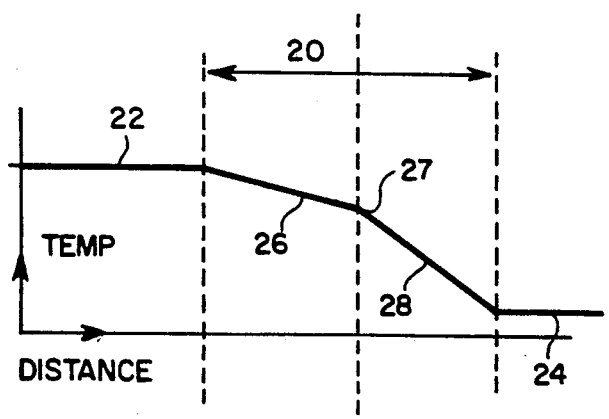
FIG. 2 is a plot of furnace temperature as a function of axial distance.

FIG. 2 illustrates a plot of temperature as a function of linear distance along the length of ampoule 14. Heating elements 19 subject the liquid phase 16 of the sample 12 to an elevated temperature level 22, at the left of the solidification region 20. Simultaneously, heating elements 23 maintain a lower temperature level 24 at the right of solidification region 20. The liquid-solid interface is indicated by reference numeral 25 in FIG. 1 and point 27 on the corresponding plot of FIG. 2. Ideally, the radially outward space in the solidification region would be packed with a perfect adiabatic material thereby creating an adiabatic zone of the furnace in which no radial heat transfer occurs between the solidifying sample material and the furnace. Conventional furnaces utilize the best-possible insulative materials to approach an ideal adiabatic region but a perfect adiabatic insulator does not exist. Therefore, radial heat transfer does occur and this results in a non-planar interface shape and potentially increases the convection effects of heating. The disadvantageous result of such problems is a non-uniform single crystal structure that affects the crystal performance after manufacture.

A further problem occurs in attempting to achieve the perfect adiabatic zone. This is due to the fact that there is a difference in thermal conductivity between the liquid and solid phases of the sample undergoing processing. Thus, as shown in FIG. 2, the liquid phase temperature gradient 26 exists at a different slope than the solid phase temperature gradient 28. Accordingly, a single uniform insulator within the desired adiabatic zone cannot, as a practical matter, minimize radial heat transfer uniformly between the furnace and sample in the solidification region.

The contribution of the present invention is to incorporate two insulative gradient sections 30 and 32 around the solidification region which will match the thermal properties of the two sample phases so that radial heat transfer from each of the solid and liquid phases is independently minimized. The desired thermal characteristics of these sections can be regulated by either using different materials of construction (i.e., different thermal conductivity) or by variations in the size and shape of the sections. Unlike the adiabatic section used in conventional Bridgman-type furnaces, the materials used for the gradient sections 30 and 32 can have relatively high thermal conductivity. Overall heat flow within the two gradient sections can be generally described as one dimensional and running in the axial direction. External insulation is provided for by the use of conventional low thermal conductivity material 41. Given the inventive concept explained herein, the actual choice of materials and shapes would only require routine experimentation by one having ordinary skill in the art.

In order to impose the desired temperature levels 22 and 24 (FIG. 2) along the sample, control thermocouples 34 are positioned at the left edge of gradient section 30, the interface therebetween and the right edge of gradient section 32. These thermocouples are connected by cable 36 to a control computer 38 which monitors the temperatures measured by the thermocouples 34. The control computer is connected to a heating element power source 40 which can then individually regulate the power going to heating elements 19 and 23. The control computer 38 actively regulates the heat generated by these heating elements so that a tailored furnace temperature profile results as indicated in FIG. 2 thereby minimizing the sample radial heat flux. As in the case of conventional crystal growing furnaces, it is necessary to translate furnace 10 in an axial direction relative to ampoule 14. This may be simply accomplished by utilizing a conventional stepper or continuous drive motor 36'.

Thus, as will be appreciated from an understanding of the present invention, an apparatus has been presented which can control the radial heat transfer in the region of solidification by ensuring a specially tailored temperature profile within the region of solidification. This will result in improved interface curvature control and thus a more perfectly uniform single crystal.

It should be understood that the invention is not limited to the exact details of construction shown and described herein for obvious modifications will occur to persons skilled in the art.

I claim:

1. A method for controlling interface curvature of a crystalline material sample undergoing single crystal growth comprising the steps:

translating two axially spaced discontinuous furnace zones, at different temperatures, along a crystalline sample for creating liquid and solid phases separated by an interface, the phases each having a different thermal conductivity thus creating temperature gradients of different slopes;

inhibiting the radial radiation around the liquid phase to a first extend;

inhibiting the radial radiation around the solid phase to a greater extend corresponding to the differences in temperature gradient between the liquid and solid phases;

resulting in minimized equal radial heat radiation from the liquid and solid phases, accompanied by axial heat flow therebetween.

* * * * *